United States Patent [19]

Schwerdt

[11] 3,824,497

[45] July 16, 1974

[54] HIGH-PURITY, FREQUENCY-STABLE, ADJUSTABLE, WIEN-BRIDGE, OSCILLATOR

[75] Inventor: Christopher B. Schwerdt, Baltimore, Md.

[73] Assignee: The United States of America as represented by the Secretary of the Navy, Washington, D.C.

[22] Filed: July 20, 1973

[21] Appl. No.: 381,109

[52] U.S. Cl. .............. 331/141, 331/108 D, 331/183
[51] Int. Cl. .............................................. H03b 5/26
[58] Field of Search ....... 331/108 D, 110, 141, 109, 331/183

[56] References Cited

UNITED STATES PATENTS

| | | | |
|---|---|---|---|
| 3,319,184 | 5/1967 | McCall | 331/141 X |
| 3,500,246 | 3/1970 | Werner | 331/141 X |

OTHER PUBLICATIONS

Popular Electronics, August 1971, p. 89.

*Primary Examiner*—Herman Karl Saalbach
*Assistant Examiner*—Siegfried H. Grimm
*Attorney, Agent, or Firm*—R. S. Sciascia; P. Schneider

[57] ABSTRACT

A high-purity, amplitude-stable, adjustable, Wien bridge oscillator utilizing a single amplifier component and a pair of nonlinear devices. A single operational amplifier is utilized in place of two amplifier components. A lamp in the degenerative-feedback path provides amplitude stabilization of the output oscillations. A back-to-back zener diode in series with a resistor is connected between the inverting input of the operational amplifier and a junction between the series resistor-capacitor arm of the bridge circuit thereby extending the linear operating-frequency range of the oscillator, improving amplitude stability of the output oscillations, and preventing output D.C. drift from feeding back to the inverting input of the operational amplifier through the back-to-back zener diode.

13 Claims, 2 Drawing Figures

HIGH-PURITY, FREQUENCY-STABLE, ADJUSTABLE, WIEN-BRIDGE, OSCILLATOR

BACKGROUND OF THE INVENTION

1. Field of the Invention

This invention relates generally to R-C tuned oscillators, and more particularly to a high-purity, frequency-stable, adjustable, Wien-bridge oscillator.

2. Description of the Prior Art

There is a wide range of uses for Wein-bridge oscillators at audio and the lower radio frequncies. These include applications as test oscillators and standard-frequency signal generators. Such applications require a high degree of amplitude and frequency stability over a wide frequency range with a minimum of distortion in the output oscillations. The problem with this type of oscillator is to keep it operating in a linear region so that clipping of the sinewave does not occur at the output for low frequencies and to ensure that the loop gain is of sufficient amplitude to sustain oscillations at higher frequencies. Also, when produced in quantity for mobile use in field environments, an oscillator must be inexpensive, compact, and rugged.

One prior art method of providing amplitude stability and widening the frequency range of a Wien-bridge oscillator is to connect a non-linear, variable impedance device in the degenerative feedback loop of the oscillator circuit. Such non-linear devices include, among others, tungsten filament lamps, zener diodes back-biased into the zener region, thermistors, unijunction transistors, and diode networks. The non-linear device is connected so that as the amplitude of the output signal of the oscillator increases, the current through the non-linear device either increases or decreases. The increased or decreased current causes an increase or decrease in the dynamic impedance of the non-linear device thereby increasing the degenerative feedback voltage which decreases the output oscillation amplitude. Of course as the amplitude of the output signal of the oscillator decreases the non-linear device operates in an opposite manner to effect an increase in the output oscillation amplitude.

However, at lower and higher frequencies, the increase and decrease in output oscillation amplitude is so great that the non-linear device can no longer completely compensate therefor and the output oscillations are either distorted or are of insufficient amplitude to sustain oscillation. Thus, this prior art method produces R-C tuned oscillators with limited linear frequency ranges. Also, when diode networks and unijunction transistors are utilized in the degenerative feedback path, it is usually necessary to derive the controlling feedback voltage from a comparator network which compares the output voltage of the oscillator with a standard or reference voltage. The reference voltage may be provided by a battery or established by a zener diode. Obviously, this technique results in a rather complex and bulky circuit which is prohibitively expensive to construct in large numbers. In addition, when a zener diode back-biased into its zener region is utilized in the degenerative feedback path, any D.C. drift at the oscillator output is also feedback resulting in distortion of the output oscillations. Furthermore, thermistors are typically very non-linear devices and as a result tend to introduce or cause considerable distortion in the output oscillations.

Prior art Wien-bridge oscillators typically utilize two amplifier stages. One amplifier stage serves as an oscillation stage inputted by the positive feedback signal followed by an inverter amplifier stage providing the 180° phase shift necessary to sustain oscillations. Both stages require biasing as well as coupling circuits therebetween, resulting in a complex, bulky and expensive oscillator.

SUMMARY OF THE INVENTION

The general purpose of this invention is to provide a Wien-bridge oscillator that is smaller, less expensive, more reliable, requires a fewer number of components, produces less distortion in the output, operates linearly over a wider frequency range, and provides greater amplitude stability than prior art Wien-bridge oscillators. To attain this the present invention provides a Wien-bridge oscillator utilizing two non-linear devices to control the gain of the oscillator and a single amplifier component. In accordance with one embodiment of this invention, the single amplifier component is an operational amplifier having an inverting and a non-inverting input. The operational amplifier substitutes for the typical two-amplifier-stage oscillator thereby reducing the size, cost and number of components utilized over prior art Wien-bridge oscillators. A lamp in the degenerative feedback path, connected between a reference voltage and the invering input of the operational amplifier, provides amplitude stabilization of the output oscillators while extending the linear operating frequency range of the oscillator. A back-to-back zener diode in series with a resistor is connected between the inverting input of the operational amplifier and a junction between the series resistor-capacitor arm of the bridge circuit. At lower and higher frequencies where large and small oscillation amplitudes can no longer be compensated for by the lamp, the back-to-back zener diode provides further compensation thereby extending the linear operating frequency range and further improving the amplitude stability of the output oscillations over prior art Wien-bridge oscillators. In addition, the capacitor between the back-to-back zener diode and the output blocks output D.C. drift from feeding back to the inverting input of the operational amplifier thereby further reducing distortion in the output oscillations.

Accordingly one object of the present invention is to provide output oscillations over a wide linear frequency range.

Another object of the invention is to provide frequency stabiity over a wide temperature range.

Still another object of the present invention is to minimize the number of components necessary for operation.

A further object of the instant invention is to minimize clipping of the output at lower frequencies thereby extending the linear frequency range of the oscillator.

A still further object of this invention is to maintain a constant output amplitude.

Another further object of the instant invention is to minimize harmonic distrotion in the output oscillations.

Still another object of the instant invention is to minimize feedback of D.C. drift at the oscillator output.

Another object of the present invention is to maximize the gain at higher frequencies thereby extending the linear frequency range of the oscillator.

One other object of this invention is to provide a small inexpensive, and reliable oscillator.

Other objects and a more complete appreciation of the present invention and its many attendant advantages will develop as the same becomes better understood by reference to the following detailed description when considered in connection with the accompanying drawings.

DESCRIPTION OF THE PREFERRED EMBODIMENT

Figure 1:
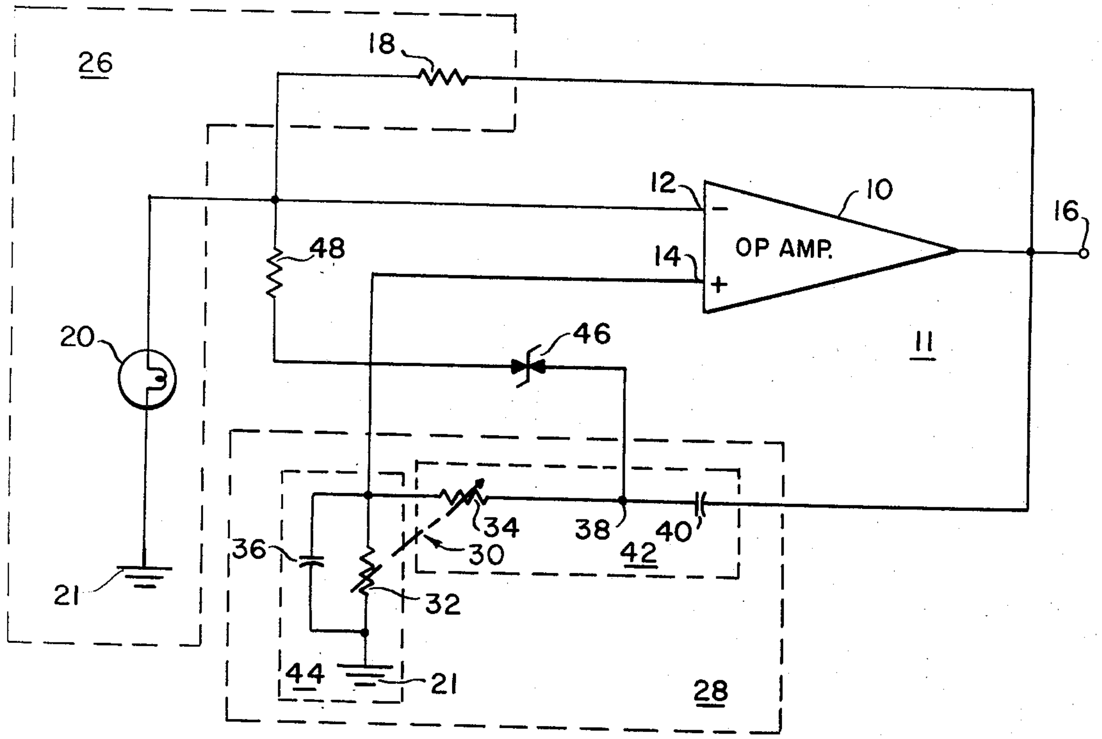
FIG. 1 is a schematic diagram of a specific embodiment of the present invention.

FIG. 1 shows a Wien-bridge oscillator 11 according to the present invention comprising an operational amplifier 10 having an inverting input 12, a non-inverting input 14, and an output 16. The output 16 is also the output of Wien-bridge oscillator 11. A Wien-bridge oscillator 11 has a resistive voltage divider 26 and a resistance - capacitance voltage divider 28 as indicated by the broken lines. The resistive voltage divider 26 forms a degenerative feedback path whereby a degenerative feedback voltage is developed at the inverting input 12. The resistance - capacitance voltage divider 28 forms a regenerative feedback path whereby a regenerative feedback voltage is developed at the non-inverting input 14.

A resistor 18 is connected between the inverting input 12 and the output 16 while a tungsten filament lamp 20 is connected between the inverting input 12 and a reference voltage 21. This reference voltage may be any point of reference potential such as ground. The resistor 18 and the lamp 20 comprise the resistive voltage divider 26. Tungsten filament lamp 20 is a nonlinear device whose impedance varies with the current through it.

A dual-gang, P.C-type potentiometer 30 has a pair of resistive arms 32 and 34. Arm 32 and a capacitor 36 are connected between the non-inverting input 14 and the reference voltage 21 forming a parallel resistance-capacitance leg 44 of resistance-capacitance voltage divider 28. Arm 34 is connected between the non-inverting input 14 and a junction 38. A capacitor 40 is connected between junction 38 and the output 16. The capacitor 40 and the arm 34 form a series resistance-capacitance arm 42 of resistance-capacitance voltage divider 28.

The oscillator will oscillate at a frequency such that the voltage developed at the non-inverting input 14 has the same phase as the voltage developed at the output 16. This occurs when the phase angle of the parallel resistance-capacitance arm 44 and the series resistance-capacitance arm 42 are the same. For the case where the resistive arm 32 equals the resistive arm 34 and the capacitance 40 equals the capacitance 36, the oscillator frequency is equal to $$fo = 1/2\,\pi\,\mathrm{RC}$$

Note that as the resistance of the dual-gang potentiometer 30 is varied so is the frequency of oscillation of oscillator 11. Also, as the frequency of oscillation increases, the voltage at the non-inverting input 14 decreases; hence the oscillation amplitude at output 16 decreases and visa versa. Thus, compensation in gain must be provided in order to prevent clipping of the output oscillation at lower frequency ranges and to provide sufficient loop gain to sustain oscillations at higher frequency ranges. This compensation is provided by lamp 20.

The compensating operation of tungsten filament lamp 20 whereby the gain of operational amplifier 10 is increased at higher frequencies and decreased at lower frequencies to maintain a constant output oscillation amplitude and widen the linear frequency range of oscillator 11 is well known in the art; see Grob and Kives, Application of Electronics, McGraw-Hill (1966), pages 412–414.

However, as the operation of oscillator 11 is required at progressively higher and lower frequency ranges, tungsten filament lamp 20 is unable to increase or decrease the gain of operational amplifier 10 sufficiently to provide linear output oscillations at a constant amplitude. Additional gain compensation is needed. To provide this additional gain compensation, a back-to-back zener diode 46 in series with a resistor 48 is connected between junction 38 and inverting input 12.

Figure 2:
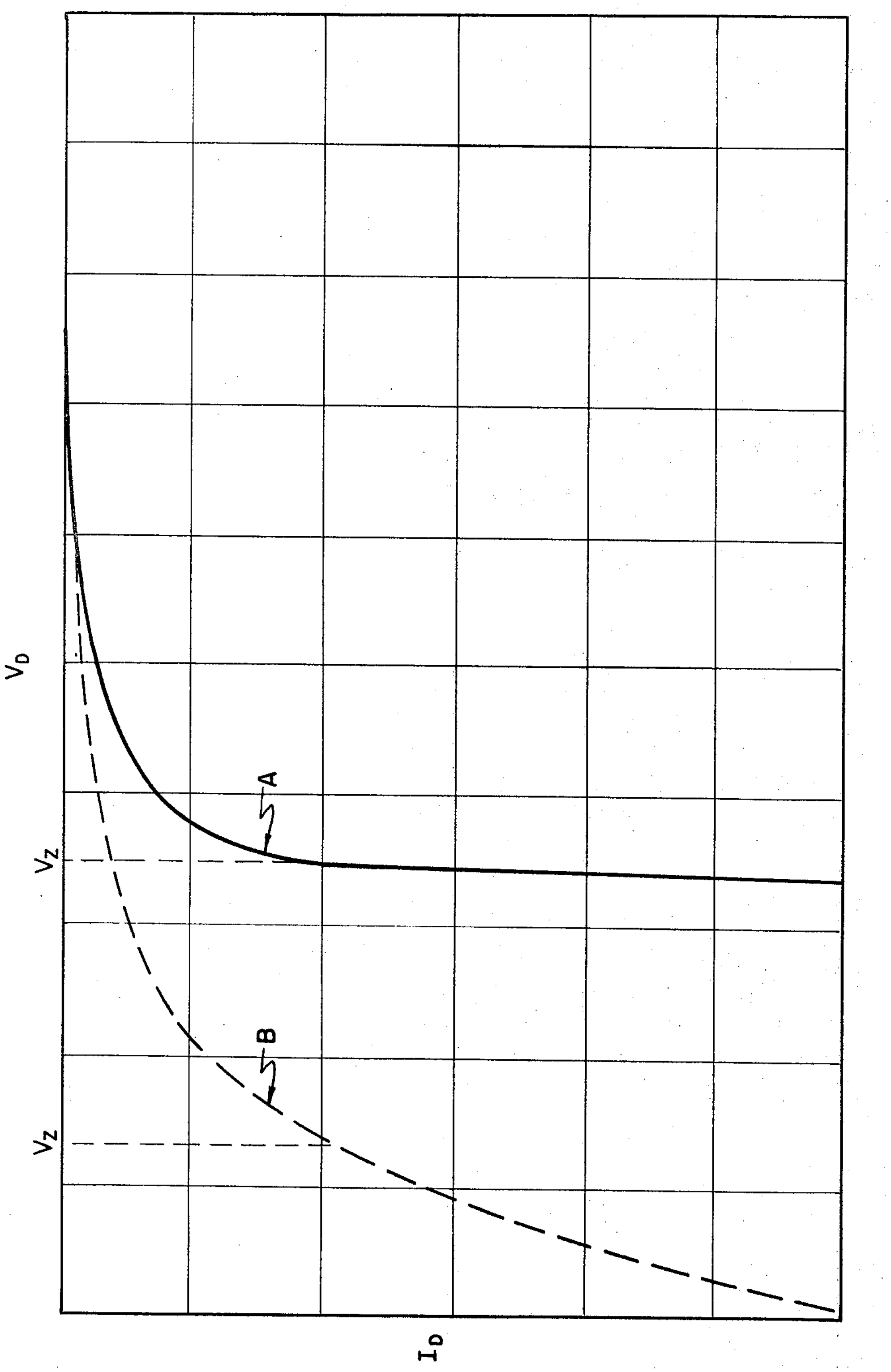
FIG. 2 illustrates the I-V characteristics of two zener diodes.

At lower oscillation frequencies where lamp 20, alone, can no longer provide sufficient gain compensation, back-to-back zener diode 46 begins to conduct shunting dual-gang potentiometer 30 and thus allowing capacitor 40 to charge more quickly. As the regenerative feedback current is shunted through back-to-back zener diode 46, the voltage at the non-inverting input 14 begins to decrease. Since the voltage at the non-inverting input 14 and the inverting input 12 are equal for all practical purposes, the voltage level at output 16 decreases, preventing clipping of the oscillations at output 16 and thereby extending the linear frequency range of oscillator 11 to progressively lower and lower frequencies. The I–V characteristic of the back-to-back zener diode 46 does not have a sharp break point in the zener-breakdown-voltage region which on one side exhibits an infinite impedance and on the other side a zero impedance. The change of slope of the I–V characteristic on either side of the zener breakdown voltage is gradual. FIG. 2 illustrates this change of slope. Curve A illustrates a zener diode whose I–V characteristic has a sharp change of slope near its breakdown voltage. Curve B illustrates a zener diode whose I–V characteristic has a gradual change of slope near its breakdown voltage. Thus, the back-to-back zener diode 46 will commence providing gain compensation at frequencies at which lamp 20 can provide sufficient gain compensation. But as the oscillation frequency is lowered beyond the point where lamp 20 can provide sufficient gain compensation, back-to-back-zener diode 46 provides the additional gain compensation necessary to prevent clipping and maintain amplitude stability of the output oscillations. Thus, the compensating effect of back-to-back zener diode 46 causes no discontinunity in the amplitude or linearity of the output oscillations. The resistor 48, placed in series with the back-to-back zener diode 46, softens the zener limit thereby reducing any distortion introduced by the zener diode.

At higher oscillation frequencies where lamp 20, alone, can no longer provide sufficient gain compensation a resistive path in parallel with lamp 20 is formed by resistor 48, back-to-back zener diode 46 and dual gang potentiometer 30. This resistive path further reduces the effective resistance of lamp 20 thereby further decreasing the voltage at the inverting input 12 and increasing the gain of operational amplifier 10. Thus, the gain compensation provided by back-to-back zener diode 46 extends the linear frequency range of oscillator 11 to progressively higher and higher frequencies.

It will be appreciated by those skilled in the art that the complete circuit diagram of the FIG. 1 includes such suitable and necessary biasing voltage sources as are usually provided in an operational amplifier circuit. Such biasing is not shown in FIG. 1.

In summary, the back-to-back zener diode 46 in conjunction with lamp 20 in a Wien-bridge oscillator extends the linear frequency range, provides greater amplitude stability, and produces less disortion in the output oscillations. The operational amplifier 10 and the dual-gang potentiometer 30 provides a smaller, less expensive, and more reliable oscillator.

Obviously, numerous modifications and variations of the present invention are possible in the light of the above teachings. It is therefore to be understood that within the scope of the appended claims the invention may be practiced otherwise than as specifically described herein.

What is claimed as new and desired to be secured by Letters Patent of the United States is:

1. An adjustable-frequency, resistance-capacitance-tuned oscillator comprising:

an amplifier having an output,
an inverting input, and
a non-inverting input;
means providing a reference voltage;
degenerative feedback means having a resistive element, and a non-linear element including an impedance having a value that varies with the current therethrough,
said elements being connected in series,
said degenerative feedback means being connected between said amplifier output and said reference voltage means;
a first junction between said resistive element and said non-linear,
said junction being connected to said inverting input;

adjustable, frequency-determining regenerative-feedback means having
a series, adjustable, resistance-caacitance network including a resistance and capacitance in series at least one of which may be variable, and
a parallel, adjustable resistance-capacitance network, including a resistance and capacitance in parallel, at least one of which may be variable,
said networks being connected in series between said amplifier output and said reference voltage;
a second junction between said series network and said parallel network, said second junction being connected to said non-inverting input;
a third junction between said resistance and capacitance of said series network,
said resistance of said series network being connected between said third junction and said second junction,
said capacitance of said series network being connected between said third junction and said amplifier output; and
a non-linear network, including an impedance having a value that varies with the current flowing therethrough connected between said third junction and said inverting input.

2. The oscillator of claim 1 wherein said non-linear network comprises a resistive element and a back-to-back zener diode connected in series.

3. In a variable-frequency, Wien-bridge oscillator comprising:

an amplifier having an output,
an inverting input, and
a non-inverting input;
means providing a reference voltage;
a Wien-bridge circuit including a parallel, variable, resistance-capacitance arm,
a series, variable, resistance-capacitance arm,
a resistance arm, and
a non-linear arm, said non-linear arm including an impedance having a value that varies with the current therethrough, said series, resistance-capacitance arm having a resistance and a capacitance in series;
a first junction between said parallel arm and said series arm,
said first junction being connected to said non-inverting input;
a second junction between said series arm and said resistance arm,
said second junction being connected to said amplifier output;
a third junction between said resistance arm and said non-linear arm,
said third junction being connected to said inverting input;
a fourth junction between said non-linear arm and said parallel arm,
said fourth junction being connected to said reference voltage means;
a fifth junction between said resistance and said capacitance of said series arm,
said resistance of said series arm being connected between said first junction and said fifth junction,
said capacitance of said series arm being connected between said fifth junction and said second junction,
the improvement comprising:
a non-linear network, including an impedance having a value that varies with the current flowing therethrough, connected between said fifth junction and said inverting input.

4. The oscillator of claim 3, wherein said non-linear network comprises a resistance and a back-to-back zener diode in series.

5. The improvement according to claim 3, wherein said non-linear netowrk comprises a back-to-back diode and a resistor connected in series.

6. A component for use in a Wien-bridge oscillator, said Wien-bridge oscillator having an operational amplifier with an inverting input terminal,
a non-inverting input terminal, and
an output terminal;
means for producing a reference voltage;
a Wien-bridge circuit including, a variable-impedance series resistance-capacitance arm, and an adjacent arm containing a variable-impedance parallel resistance-capacitance arm, and connections from said input terminals to one diagonal of said bridge; connections from said output terminal and a point of reference voltage to the other diagonal of said bridge, said component comprising: an impedance having a value that varies with the current flowing therethrough connected between said inverting input terminal and a point between said resistance and said capacitance of said series resistance-capacitance arm, whereby the linear frequency range of said oscillator is extended.

7. The component according to claim 6, wherein said component comprises resistive means and a back-to-back zener diode connected in series therewith.

8. A variable-frequency impedance-tuned oscillator comprising:

a variable-frequency selective network having a series resistance-capacitance arm, whose impedance is variable, having a resistance element and a capacitance element in series;

a parallel resistance-capacitance arm, whose impedance is variable, having a resistance element and a capacitance element in parallel, said series arm and said parallel arm connected in series;

a variable-impedance non-linear network having a resistance and a non-linear impedance connected in series, said non-linear impedance having a value that varies with the current flowing therethrough;

a second non-linear impedance network including an impedance having a value that varies with the current flowing therethrough;

an amplifier having an inverting input terminal, a non-inverting input terminal, and an output terminal;

means providing a source of reference potential;

a connection between one terminal of said parallel arm and said reference potential, and the other terminal being connected to said non-inverting input terminal;

a connection from said output terminal to said series arm and to said variable-impedance non-linear network;

a connection from one terminal of said second non-linear impedance network to said inverting input terminal and to a point between said resistance and non-linear impedance of said variable-impedance non-linear network, and the other terminal being connected to a point between said resistance and said capacitance of said series arm; and a connection from said reference voltage means to said non-linear impedance of said variable-impedance non-linear network.

9. The invention in accordance with claim 8, wherein said second non-linear impedance network comprises a resistance network and a back-to-back zener diode in series.

10. The invention in accordance with claim 8, wherein said resistance of said variable-impedance non-linear network is connected between said output terminal and said inverting terminal.

11. A variable-frequency impedance-tuned oscillator comprising:

a bridge circuit having four arms, one of which is a variable-impedance resistor-capacitor series combination, a second arm having a non-linear network including an impedance having a value that varies with the current flowing therethrough, a third arm having a variable-impedance resistor-capacitor parallel combination, and a fourth resistive arm;

a differential amplifier having an output terminal, a non-inverting input terminal, and an inverting input terminal;

connections from said input terminals across one diagonal of said bridge;

connections from said output terminal and a point of reference potential to the other diagonal of said bridge; and a second non-linear impedance network including an impedance having a value that varies with the current flowing therethrough, connected between said inverting terminal and a point between the resistor and capacitor of said resistor-capacitor series arm.

12. An oscillator according to claim 11, wherein said second non-linear impedance network comprises a resistance network and a back-to-back zener diode in series.

13. An oscillator according to claim 11, wherein:

said first arm is connected between said output terminal and said non-inverting terminal;

said second arm is connected between said inverting terminal and said reference voltage; and said third arm is connected between said non-inverting terminal and said reference voltage.

* * * * *